(12) United States Patent                  (10) Patent No.:     US 11,476,269 B2
    Dai                                    (45) Date of Patent:       Oct. 18, 2022

(54) METHOD FOR MANUFACTURING 1.5T SONOS FLASH MEMORY

(71) Applicant: Shanghai Huali Integrated Circuit Corporation, Shanghai (CN)

(72) Inventor: Shugang Dai, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 127 days.

(21) Appl. No.: 16/800,216

(22) Filed: Feb. 25, 2020

(65) Prior Publication Data

US 2020/0373320 A1    Nov. 26, 2020

(30) Foreign Application Priority Data

May 23, 2019  (CN) .......................... 201910432630.9

(51) Int. Cl.
    *H01L 29/423*       (2006.01)
    *G11C 16/04*        (2006.01)
    *H01L 27/11573*     (2017.01)
    *H01L 27/1157*      (2017.01)

(52) U.S. Cl.
    CPC .... *H01L 27/11573* (2013.01); *G11C 16/0483* (2013.01); *H01L 27/1157* (2013.01); *H01L 29/42328* (2013.01)

(58) Field of Classification Search
    CPC ........ H01L 27/11517–1156; H01L 2924/1438; H01L 29/42324–42336; H01L 29/788–7889; G11C 11/5621–5642; G11C 16/0408–0458; G11C 16/0483; G11C 27/005
    See application file for complete search history.

(56) References Cited

U.S. PATENT DOCUMENTS 6,324,095 B1 *  11/2001  McPartland ..........  H01L 27/115
                                              365/185.05
10,128,259 B1 *  11/2018  Yang .................  H01L 21/31111
                (Continued)

FOREIGN PATENT DOCUMENTS

CN        103855163 A       6/2014
CN        104538363 A       4/2015
                (Continued)

OTHER PUBLICATIONS

May 20, 2021—(CN) Search Report Appn 201910432630.9.

*Primary Examiner* — Allen L Parker
*Assistant Examiner* — Gustavo G Ramallo
(74) *Attorney, Agent, or Firm* — Banner & Witcoff, Ltd.

(57) ABSTRACT

Embodiments described herein relate to a method for manufacturing a 1.5T SONOS flash memory. First, a first polysilicon gate layer is deposited and formed on a semiconductor substrate, then a formation area of a memory gate is defined on the first polysilicon gate layer, polysilicon in the formation area of the memory gate is etched away, and etching is stopped on a gate oxide layer. Next, an ONO layer and a second polysilicon gate layer are sequentially deposited, chemical mechanical polishing is performed on the second polysilicon gate layer, the ONO layer remaining on the top of the first polysilicon gate layer is cleaned away, and then gate structures of a logic device and a 1.5T SONOS device are formed at the same time.

15 Claims, 3 Drawing Sheets

(56) References Cited

U.S. PATENT DOCUMENTS

| | | | |
|---|---|---|---|
| 2002/0003252 A1* | 1/2002 | Iyer | G11C 16/3418 257/315 |
| 2003/0201491 A1* | 10/2003 | Chung | H01L 27/11521 257/324 |
| 2004/0102026 A1* | 5/2004 | Wong | H01L 21/26586 438/527 |
| 2007/0279987 A1* | 12/2007 | Fang | H01L 27/11521 365/185.18 |
| 2009/0095995 A1* | 4/2009 | Kawashima | H01L 27/11526 257/296 |
| 2011/0156123 A1* | 6/2011 | Fumitake | H01L 29/42348 257/315 |
| 2015/0348786 A1* | 12/2015 | Loiko | H01L 29/7883 257/316 |
| 2017/0133394 A1* | 5/2017 | Ogata | H01L 27/11563 |
| 2018/0315764 A1* | 11/2018 | Yang | H01L 27/11521 |

FOREIGN PATENT DOCUMENTS

| | | |
|---|---|---|
| CN | 106298680 A | 1/2017 |
| CN | 108807396 A | 11/2018 |

\* cited by examiner

METHOD FOR MANUFACTURING 1.5T SONOS FLASH MEMORY

CROSS REFERENCE TO RELATED APPLICATIONS

The present application claims priority to and the benefit of Chinese Patent Application No. 201910432630.9 filed on May 23, 2019, the disclosure of which is incorporated herein by reference in its entirety as part of the present application.

BACKGROUND

The present disclosure relates to a method for manufacturing semiconductor integrated circuits, in particular to a method for manufacturing a 1.5T SONOS flash memory.

In semiconductor integrated circuits, the flash memory is widely applied to consumer electronics such as mobile phones, digital cameras, and portable systems due to its non-volatile characteristic. The non-volatile storage technologies primarily include the floating gate technology, the split gate technology, and the silicon-oxide-nitride-oxide-silicon (SONOS) technology. SONOS flash memories are widely used due to its advantages such as the simple process, low operating voltage, high data reliability, and easy integration into standard CMOS processes.

The common structure of a 1.5T SONOS flash memory includes two devices, one is a select gate (SG), and the other is a memory gate (MG). A $SiO_2$—$Si_3N_4$—$SiO_2$ (ONO) layer is used as a gate dielectric in the memory gate, where the charge is stored in $Si_3N_4$. Two layers of gate polysilicon are required to form the devices of the 1.5T SONOS structure.

Currently, a mainstream approach is as follows: after the first layer of gate polysilicon is deposited, the gate of one of the devices is first formed by means of etching, where the device can be a select gate or a memory gate; then the gate dielectric of the other device and the gate dielectrics of peripheral logic devices (such as a core device, and an input-output device) are produced; next, the second layer of polysilicon is deposited, the second layer of polysilicon is used to produce the gates of the peripheral logic devices, and the second layer of polysilicon is used to form the gate of the other device, thereby completing manufacturing of the 1.5T SONOS flash memory.

As described above, after completion of the first device in the 1.5T SONOS flash memory, in order to correctly form the gate dielectrics of the second device and peripheral logic devices, and to correctly form the shape of the second gate in etching of the second layer of polysilicon gate, additional photomasks and processes need to be added, thereby increasing the process complexity and cost. In addition, the process of forming the 1.5T SONOS device interacts with the process of manufacturing the logic device, thereby affecting device performance.

BRIEF SUMMARY

According to embodiments described herein there is provided a method for manufacturing a 1.5T SONOS flash memory. The method for manufacturing a 1.5T SONOS flash memory provided by the present disclosure comprises: S1: providing a semiconductor substrate, forming a field oxide layer on the semiconductor substrate, isolating to form a plurality of active regions by the field oxide layer, and then performing a well implantation process in the plurality of active regions to form a P well or an N well; S2: forming a gate oxide layer on the semiconductor substrate; S3: forming a first polysilicon gate layer; S4: defining a position of a memory gate by means of a photolithography process and an etching process, etching away the first polysilicon gate layer in the area of the position of the memory gate, and stopping etching on the gate oxide layer to define a formation area of the memory gate; S5: cleaning away the gate oxide layer in the formation area of the memory gate on the semiconductor substrate to expose the semiconductor substrate, and then sequentially depositing an ONO layer and a second polysilicon gate layer; S6: performing a planarization process on the second polysilicon gate layer, and stopping the planarization process on the ONO layer; S7: cleaning away the ONO layer on the first polysilicon gate layer, and then forming a gate structure of a logic device and a gate structure of a 1.5T SONOS device by means of a photolithography process and an etching process; and S8: completing a subsequent process of the 1.5T SONOS device and the logic device to complete manufacturing of the 1.5T SONOS flash memory.

DETAILED DESCRIPTION

The technical solutions in the present disclosure will be clearly and completely described below with reference to the drawings. Obviously, the described embodiments are some of the embodiments of the present disclosure, but not all of the embodiments. Based on the embodiments of the present disclosure, all other embodiments obtained by a person of ordinary skill in the art without creative efforts shall fall within the protection scope of the present disclosure.

In one embodiment of the present disclosure, a method for manufacturing a 1.5T SONOS flash memory is provided. The method for manufacturing a 1.5T SONOS flash memory provided by the present disclosure comprises: S1: providing a semiconductor substrate, forming a field oxide layer on the semiconductor substrate, isolating to form a plurality of active regions by the field oxide layer, and then performing a well implantation process in the plurality of active regions to form a P well or an N well; S2: forming a gate oxide layer on the semiconductor substrate; S3: forming a first polysilicon gate layer; S4: defining a position of a memory gate by means of a photolithography process and an etching process, etching away the first polysilicon gate layer in the area of the position of the memory gate, and stopping etching on the gate oxide layer to define a formation area of the memory gate; S5: cleaning away the gate oxide layer in the formation area of the memory gate on the semiconductor substrate to expose the semiconductor substrate, and then sequentially depositing an ONO layer and a second polysilicon gate layer; S6: performing a planarization process on the second polysilicon gate layer, and stopping the planarization process on the ONO layer; S7: cleaning away the ONO layer on the first polysilicon gate layer, and then forming a gate structure of a logic device and a gate structure of a 1.5T SONOS device by means of a photolithography process and an etching process; and S8: completing a subsequent process of the 1.5T SONOS device and the logic device to complete manufacturing of the 1.5T SONOS flash memory.

Figure 1:
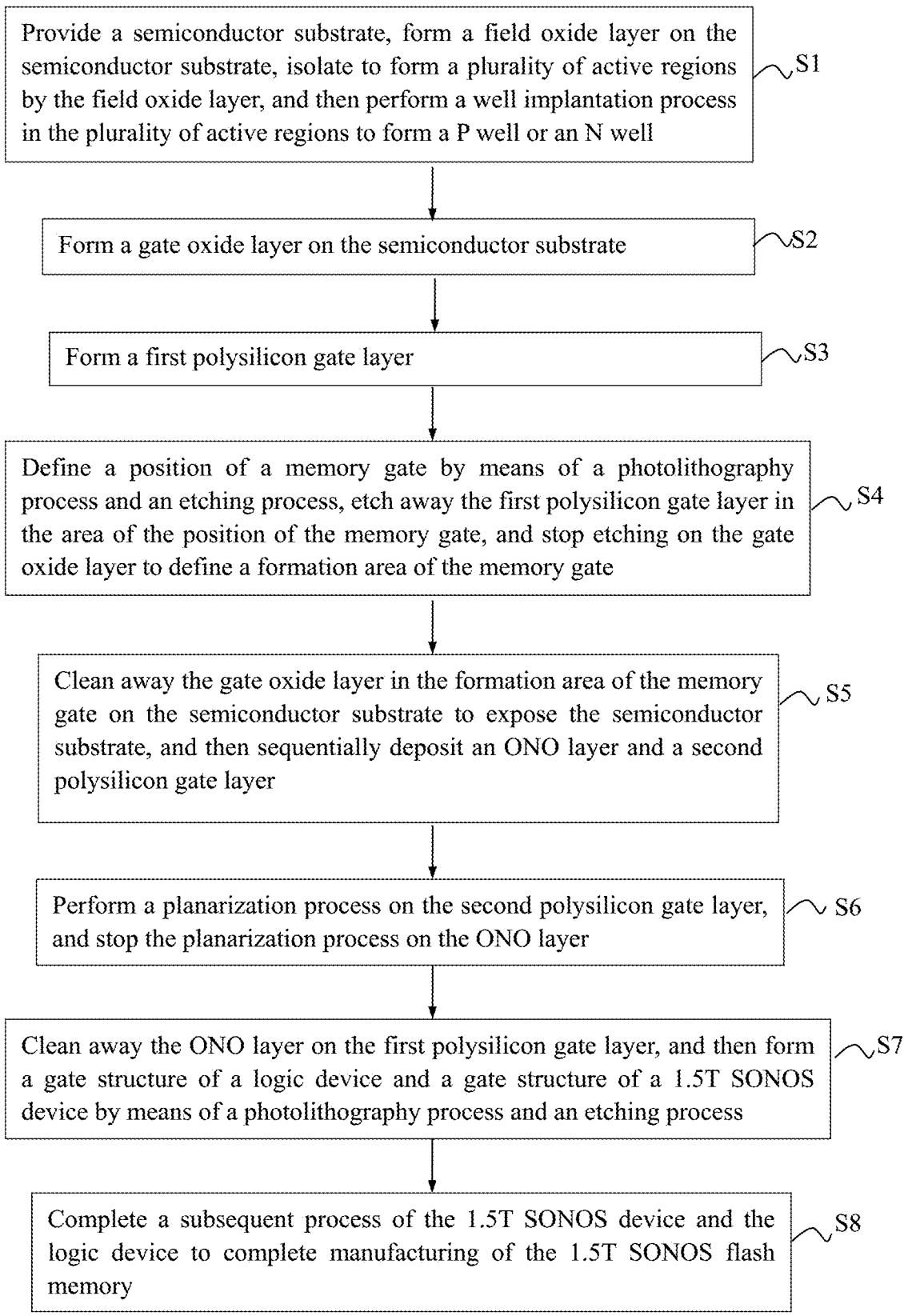
FIG. 1 is a flowchart of a method for manufacturing a 1.5T SONOS flash memory in one embodiment of the present disclosure.

Reference can be made to FIG. 1, which is a flowchart of a method for manufacturing a 1.5T SONOS flash memory in one embodiment of the present disclosure. Reference can be further made to FIGS. 2a-2g, which are schematic views of a process of manufacturing a 1.5T SONOS flash memory in one embodiment of the present disclosure. As shown in FIG. 1 and FIGS. 2a-2h, the method for manufacturing a 1.5T SONOS flash memory provided by the present disclosure comprises the following steps.

S1: A semiconductor substrate is provided, a field oxide layer is formed on the semiconductor substrate, a plurality of active regions are formed by isolating by the field oxide layer, and then a well implantation process is performed in the plurality of active regions to form a P well or an N well.

Figure 2A:
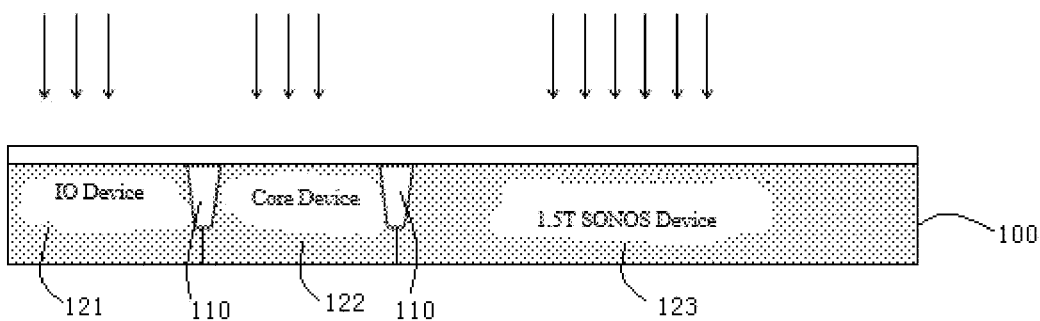
FIGS. 2a-2g show a schematic view of a process of manufacturing a 1.5T SONOS flash memory in one embodiment of the present disclosure.

As shown in FIG. 2a, the field oxide layer 110 is formed on the semiconductor substrate 100, such as a silicon substrate. The field oxide layer 110 is usually formed by means of a shallow trench isolation (STI) process. An active region of a logic device and an active region 123 of a 1.5T SONOS device are formed by isolating by the field oxide layer 110. Generally, the active region of the logic device comprises an active region 121 of a core device and an active region 122 of an input-output (10) device. The active region of the logic device is used to form the logic device. For example, the core device such as a core nFET and/or a core pFET is formed in the active region 121 of the core device, the input-output device such as an input-output nFET and/or an input-output pFET is formed in the active region 122 of the input-output (TO) device, and the active region 123 of the 1.5T SONOS device is used to form a select gate (SG) and a memory gate (MG) of the flash memory.

S2: A gate oxide layer is formed on the semiconductor substrate.

Figure 2B:
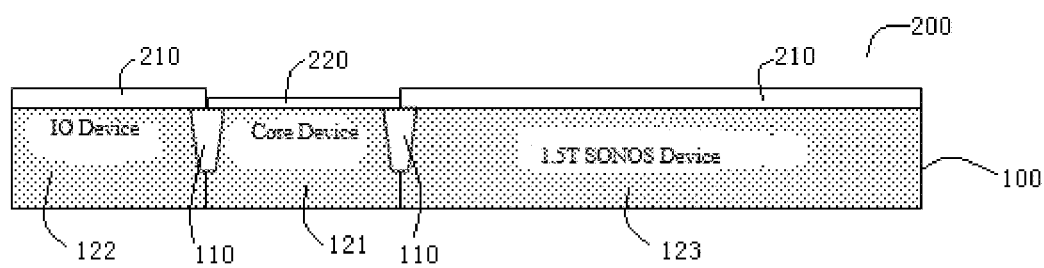

As shown in FIG. 2b, the gate oxide layer 200 is formed on the semiconductor substrate 100. The gate oxide layer 200 comprises a first gate oxide layer 210 in the active region 123 of the 1.5T SONOS device and a second gate oxide layer 220 in the active region 121 of the core device, and the first gate oxide layer 210 is thicker than the second gate oxide layer 220. More specifically, in one embodiment of the present disclosure, the first gate oxide layer 210 is also formed in the active region 122 of the input-output (10) device, that is, the thickness of the gate oxide layer in the active region 122 of the input-output (10) device is the same as that of the gate oxide layer in the active region 123 of the 1.5T SONOS device.

In one embodiment of the present disclosure, the gate oxide layer 200 is formed by means of an oxidation process.

In one embodiment of the present disclosure, the thickness of the first gate oxide layer 210 is between 35 Å and 150 Å.

Further, in one embodiment of the present disclosure, the thickness of the second gate oxide layer 220 is between 15 Å and 35 Å.

S3: A first polysilicon gate layer is formed.

Figure 2C:
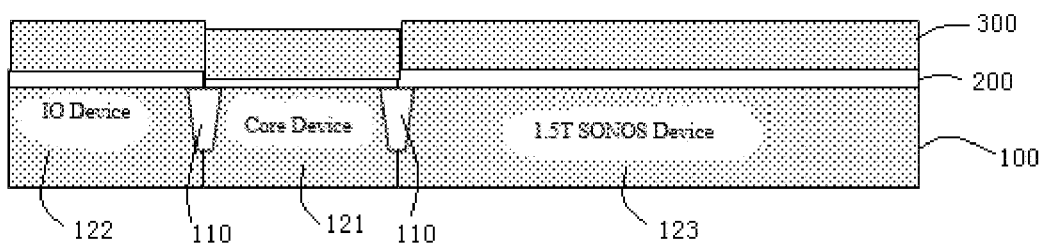

As shown in FIG. 2c, the first polysilicon gate layer 300 is formed on the basis of step S2. In one embodiment of the present disclosure, the first polysilicon gate layer 300 is formed by means of a deposition process. More specifically, the first polysilicon gate layer 300 is formed by means of a low pressure chemical vapor deposition (LPCVD) process.

S4: A position of the memory gate is defined by means of a photolithography process and an etching process, the first polysilicon gate layer in the area of the position of the memory gate is etched away, and etching is stopped on the gate oxide layer to define a formation area of the memory gate.

Figure 2D:
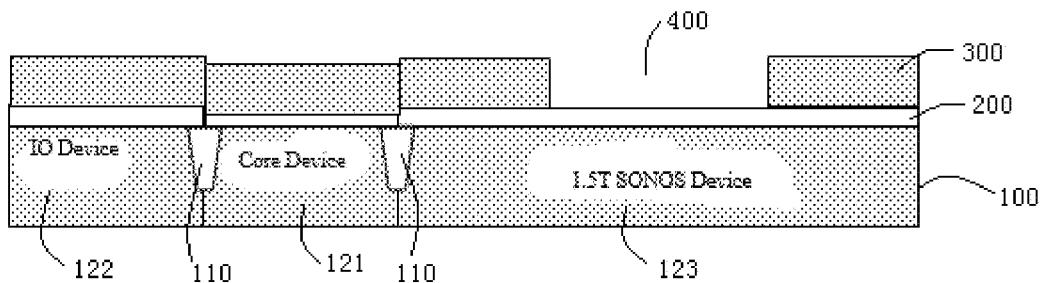

As shown in FIG. 2d, the first polysilicon gate layer 300 in a portion of the active region 123 of the 1.5T SONOS device is etched away, and etching is stopped on the first gate oxide layer 210 to define the formation area 400 of the memory gate.

S5: The gate oxide layer in the formation area of the memory gate on the semiconductor substrate is cleaned away to expose the semiconductor substrate, and then an ONO layer and a second polysilicon gate layer are sequentially deposited.

Figure 2E:
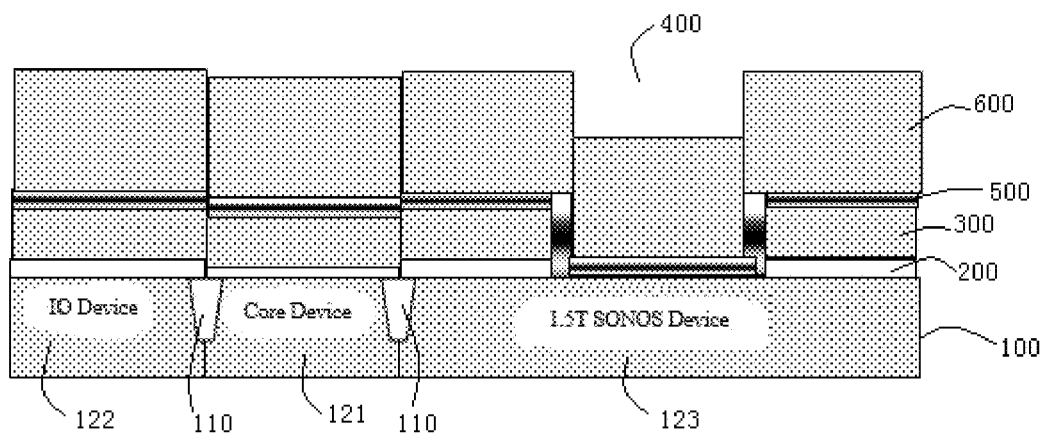

As shown in FIG. 2e, the gate oxide layer 200 in the formation area 400 of the memory gate on the semiconductor substrate 100 is cleaned away to expose the semiconductor substrate 100 in the formation area 400 of the memory gate, and then the ONO layer 500 is deposited such that the ONO layer 500 covers the surface of the exposed semiconductor substrate 100 and the surface of the exposed first polysilicon gate layer 300. Then the second polysilicon gate layer 600 is deposited on the ONO layer 500.

In one embodiment of the present disclosure, the thickness of the second polysilicon gate layer 600 is greater than the thickness of the first polysilicon gate layer 300. In one embodiment of the present disclosure, the ONO layer 500 sequentially comprises a first silicon oxide layer, a silicon nitride layer, and a second silicon oxide layer from bottom to top, the first silicon oxide layer is a tunneling oxide layer of the device, the silicon nitride layer is a data storage medium layer, and the second silicon oxide layer is a blocking oxide layer.

In one embodiment of the present disclosure, the gate oxide layer 200 in the formation area 400 of the memory gate on the semiconductor substrate 100 is cleaned away by hydrogen fluoride (HF).

In one embodiment of the present disclosure, the ONO layer 500 is deposited and formed by means of a low pressure chemical vapor deposition (LPCVD) process or an atomic layer deposition (ALD) manner.

In one embodiment of the present disclosure, the second polysilicon gate layer 600 is formed by means of a low pressure chemical vapor deposition (LPCVD) process.

S6: A planarization process is performed on the second polysilicon gate layer and stopped on the ONO layer.

Figure 2F:
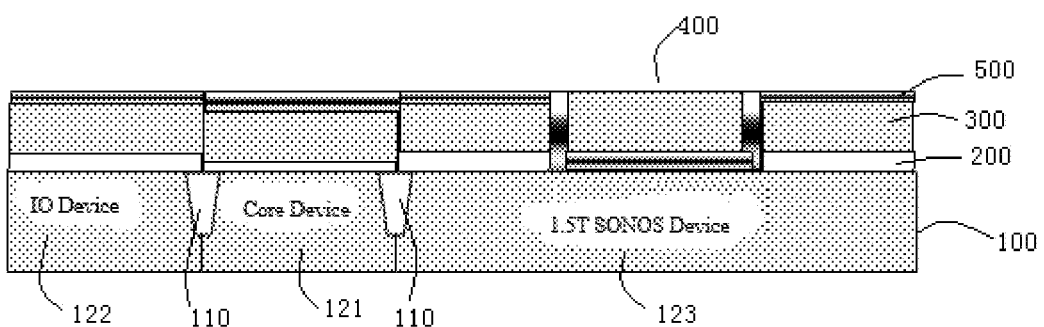

As shown in FIG. 2f, the planarization process is performed to remove the second polysilicon gate layer and stopped on the ONO layer 500. In one embodiment of the present disclosure, the planarization process is a chemical mechanical polishing process.

S7: The ONO layer on the first polysilicon gate layer is cleaned away, and then a gate structure of the logic device and a gate structure of the 1.5T SONOS device are formed by means of a photolithography process and an etching process.

Figure 2G:
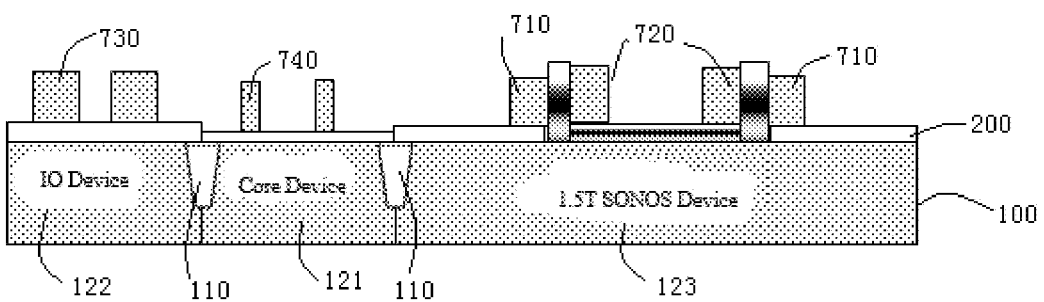

As shown in FIG. 2g, the ONO layer 500 on the first polysilicon gate layer 300 is cleaned away, and the ONO layer 500 covering the semiconductor substrate 100 and the side edge of the first polysilicon gate layer 300 in the formation area 400 of the memory gate is remained. More specifically, as shown in FIG. 2g, the gate structures in the active region 121 of the core device, in the active region 122 of the input-output (IO) device, and in the active region 123 of the 1.5T SONOS device are then formed by means of a photolithography process and an etching process. The gate structure of the 1.5T SONOS device comprises a gate structure 720 of the memory gate and a gate structure 710 of the select gate, and the gate structure of the logic device comprises a gate structure 730 of the input-output (IO) device and a gate structure 740 of the core device. More specifically, in one embodiment of the present disclosure, the gate structure 720 of the memory gate comprises an ONO layer and a polysilicon layer on the ONO layer, and the gate structure 710 of the select gate comprises a gate oxide layer and a polysilicon layer on the gate oxide layer. More specifically, in one embodiment of the present disclosure, the gate structure of the logic device and the gate structure of the 1.5T SONOS device are formed by using one photomask through one time of the photolithography process and etching process.

S8: A subsequent process of the 1.5T SONOS device and the logic device is completed to complete manufacturing of the 1.5T SONOS flash memory.

For example, in one embodiment of the present disclosure, steps such as lightly doped drain (LDD) implantation, a side wall process, and an anneal process are performed after step S7 to complete manufacturing of the 1.5T SONOS device and the logic device.

Further, in one embodiment of the present disclosure, after step S4, the method further comprises step S41: performing adjustment and injection of a threshold voltage Vt in the formation area of the memory gate.

In conclusion, first, the first polysilicon gate layer is deposited and formed on the semiconductor substrate, then the formation area of the memory gate is defined on the first polysilicon gate layer, polysilicon in the formation area of the memory gate is etched away, and etching is stopped on the gate oxide layer; next, the ONO layer and the second polysilicon gate layer are sequentially deposited, chemical mechanical polishing is performed on the second polysilicon gate layer, the ONO layer remaining on the top of the first polysilicon gate layer is cleaned away, and then the gate structures of the logic device and the 1.5T SONOS device are formed at the same time. In this way, the number of required photomasks is reduced, the process is simple, the cost is low, and the process of forming the 1.5T SONOS device does not interact with the process of manufacturing the logic device, thereby improving device performance.

Finally, it should be noted that the above embodiments are merely used for illustration of the technical solutions of the present disclosure, but not for limitation. Although the present disclosure is described in detail with reference to the above embodiments, a person of ordinary skill in the art should understand that, he can still make modifications to the technical solutions described in the embodiments, or make equivalent replacements to some or all of the technical features, while these modifications or replacements shall not deviate the essence of the corresponding technical solutions from the ranges of the technical solutions of the embodiments of the present disclosure.

What is claimed is:

1. A method for manufacturing a 1.5T SONOS flash memory, comprising:
   S1: providing a semiconductor substrate, forming a field oxide layer on the semiconductor substrate, isolating to form a plurality of active regions by the field oxide layer, and then performing a well implantation process in the plurality of active regions to form a P well or an N well, wherein in step S1, an active region of a logic device and an active region of a 1.5T SONOS device are formed by isolating by the field oxide layer, wherein the active region of the logic device comprises an active region of a core device and an active region of an input-output device;
   S2: forming a gate oxide layer on the semiconductor substrate, wherein the gate oxide layer comprises a first gate oxide layer in the active region of the 1.5T SONOS device and a second gate oxide layer in the active region of the core device, and the first gate oxide layer is thicker than the second gate oxide layer;
   S3: forming a first polysilicon gate layer;
   S4: defining a position of a memory transistor via a photolithography process and an etching process, etching away the first polysilicon gate layer in an area of the position of the memory transistor, and stopping etching on the gate oxide layer to define a formation area of the memory transistor, the first polysilicon gate layer covers an external area of the formation area of the memory transistor, and the formation area of the memory transistor is larger than a formation area of a gate structure of the memory transistor;
   S5: cleaning away the gate oxide layer in the formation area of the memory transistor on the semiconductor substrate to expose the semiconductor substrate, and then sequentially depositing an ONO layer and a second polysilicon gate layer;
   S6: performing a planarization process on the second polysilicon gate layer, and stopping the planarization process on the ONO layer;
   S7: cleaning away the ONO layer on the first polysilicon gate layer, a top surface of the first polysilicon gate layer and a top surface of the second polysilicon gate layer are exposed and form a top surface of a polysilicon layer together, the top surface of the polysilicon layer is a flat surface; and then forming a gate structure of the logic device and a gate structure of the 1.5T SONOS device via a second photolithography process and a second etching process, the gate structure of the logic device and the gate structure of the 1.5T SONOS device are formed by using one photomask through the second photolithography process and the second etching process, wherein the gate structure of the 1.5T SONOS device comprises the gate structure of the memory transistor and a gate structure of a select transistor, the gate structure of the memory transistor comprises the ONO layer and the second polysilicon gate layer on the ONO layer, and the gate structure of the select transistor comprises the first gate oxide layer and the first polysilicon gate layer on the first gate oxide layer; and
   S8: completing a subsequent process of the 1.5T SONOS device and the logic device to complete manufacturing of the 1.5T SONOS flash memory.

2. The method for manufacturing the 1.5T SONOS flash memory according to claim 1, wherein a thickness of the first gate oxide layer is between 35 Å and 150 Å.

3. The method for manufacturing the 1.5T SONOS flash memory according to claim 2, wherein in step S2, the gate oxide layer further comprises a gate oxide layer in the active region of the input-output device, and a thickness of the gate oxide layer in the active region of the input-output device is the same as that of the first gate oxide layer in the active region of the 1.5T SONOS device.

4. The method for manufacturing the 1.5T SONOS flash memory according to claim 2, wherein the first polysilicon gate layer is formed via a low pressure chemical vapor deposition (LPCVD) process.

5. The method for manufacturing the 1.5T SONOS flash memory according to claim 1, wherein a thickness of the second gate oxide layer is between 15 Å and 35 Å.

6. The method for manufacturing the 1.5T SONOS flash memory according to claim 1, wherein in step S2, the gate oxide layer further comprises a gate oxide layer in the active region of the input-output device, and a thickness of the gate oxide layer in the active region of the input-output device is the same as that of the first gate oxide layer in the active region of the 1.5T SONOS device.

7. The method for manufacturing the 1.5T SONOS flash memory according to claim 1, wherein in step S2, the gate oxide layer is formed via an oxidation process.

8. The method for manufacturing the 1.5T SONOS flash memory according to claim 1, wherein in step S3, the first polysilicon gate layer is formed via a deposition process.

9. The method for manufacturing the 1.5T SONOS flash memory according to claim 8, wherein the gate oxide layer in the formation area of the memory transistor on the semiconductor substrate is cleaned away by hydrogen fluoride (HF).

10. The method for manufacturing the 1.5T SONOS flash memory according to claim 8, wherein the ONO layer is deposited and formed via a low pressure chemical vapor deposition (LPCVD) process or an atomic layer deposition (ALD) manner.

11. The method for manufacturing the 1.5T SONOS flash memory according to claim 8, wherein the ONO layer sequentially comprises a first silicon oxide layer, a silicon nitride layer, and a second silicon oxide layer from bottom to top, the first silicon oxide layer is a tunneling oxide layer of the 1.5T SONOS device, the silicon nitride layer is a data memory medium layer, and the second silicon oxide layer is a blocking oxide layer.

12. The method for manufacturing the 1.5T SONOS flash memory according to claim 1, wherein the first polysilicon gate layer is formed via a low pressure chemical vapor deposition (LPCVD) process.

13. The method for manufacturing the 1.5T SONOS flash memory according to claim 1, wherein in step S5, the gate oxide layer in the formation area of the memory transistor on the semiconductor substrate is cleaned away to expose the semiconductor substrate in the formation area of the memory transistor, and then the ONO layer is deposited such that the ONO layer covers a surface of the exposed semiconductor substrate and a surface of the exposed first polysilicon gate layer.

14. The method for manufacturing the 1.5T SONOS flash memory according to claim 1, wherein a thickness of the second polysilicon gate layer is greater than a thickness of the first polysilicon gate layer.

15. The method for manufacturing the 1.5T SONOS flash memory according to claim 1, after step S4, further comprising step S41: performing adjustment and injection of a threshold voltage Vt in the formation area of the memory transistor.

* * * * *